(12) United States Patent
Crook

(10) Patent No.: US 9,099,371 B1
(45) Date of Patent: Aug. 4, 2015

(54) BARRIER PHOTODETECTOR WITH NO CONTACT LAYER

(71) Applicant: LOCKHEED MARTIN CORPORATION, Bethesda, MD (US)

(72) Inventor: Adam Crook, Goleta, CA (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 0 days.

(21) Appl. No.: 13/861,642

(22) Filed: Apr. 12, 2013

(51) Int. Cl.
*H01L 27/14* (2006.01)
*H01L 21/00* (2006.01)
*H01L 27/146* (2006.01)

(52) U.S. Cl.
CPC ...... *H01L 27/1463* (2013.01); *H01L 27/14683* (2013.01)

(58) Field of Classification Search
CPC .................. H01L 27/14609; H01L 27/14643; H01L 31/0232; H01L 31/103; H01L 27/1463; H01L 27/14683
USPC ......... 257/233, 290, 291, 292, 293, 414, 431, 257/436, 438, 443, 447, 461, 464, 466, 257/E33.076, E31.001, E31.054, E31.063, 257/E31.058, E31.115, E27, 133; 250/200, 250/205, 208.1; 438/48, 57, 66
See application file for complete search history.

(56) References Cited

U.S. PATENT DOCUMENTS

| | | | | |
|---|---|---|---|---|
| 4,679,063 A | * | 7/1987 | White | 257/187 |
| 5,652,435 A | * | 7/1997 | Martin et al. | 257/21 |
| 7,687,871 B2 | | 3/2010 | Maimon | |
| 8,044,435 B2 | | 10/2011 | Scott et al. | |
| 2006/0145190 A1 | * | 7/2006 | Salzman et al. | 257/192 |
| 2007/0215900 A1 | * | 9/2007 | Maimon | 257/184 |
| 2008/0111152 A1 | * | 5/2008 | Scott et al. | 257/188 |
| 2011/0204388 A1 | * | 8/2011 | Jeong et al. | 257/88 |
| 2013/0020666 A1 | * | 1/2013 | Smith | 257/432 |

OTHER PUBLICATIONS

DeCuir et al. Addressing surface leakage in type II InAs/GaSb superlattice matereials using novel approaches to surface passivation. Proc. of SPIE, vol. 8155, pp. 815508-1-815508-8.*
DeCuir et al. Long-wave type II superlattice detectos with unipolar electron and hole barriers. Optical Engineering, 2012, vol. 51, pp. 124001-1-124001-8.*

\* cited by examiner

*Primary Examiner* — Galina Yushina
(74) *Attorney, Agent, or Firm* — Terry M. Sanks, Esq.; Beusse Wolter Sanks & Maire, P.A.

(57) ABSTRACT

A barrier-type photo-detector, such as an infra-red detector, is disclosed. The detector may include an absorber layer having predetermined majority and minority carrier types with corresponding energy bands; and a Barrier made, at least in part, of a semiconductor with a Barrier energy gap and corresponding conduction and valence bands, a first side of said Barrier adjacent a first side of said absorber layer. Metal contact regions may be disposed on the barrier layer, the metal contact regions delineating pixels where image data may be read out from the photo-detector; wherein the Barrier is configured so as to allow minority carrier current flow while blocking majority carrier current flow between the absorber layer and the metal contact regions.

16 Claims, 9 Drawing Sheets

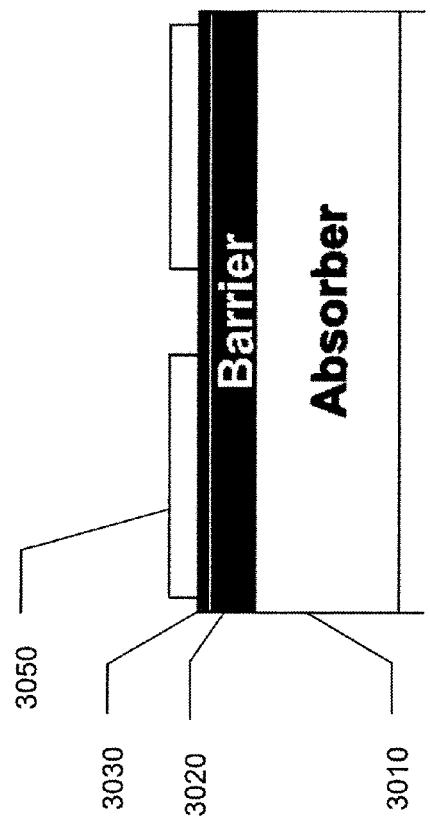

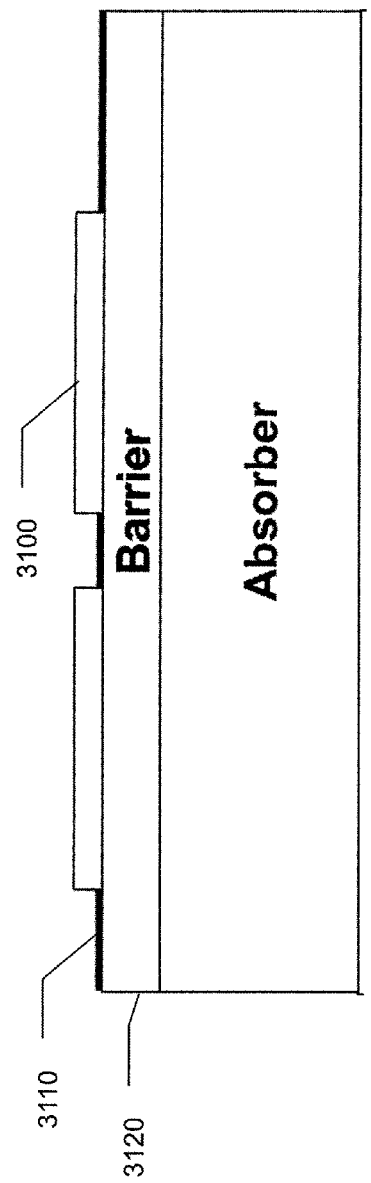

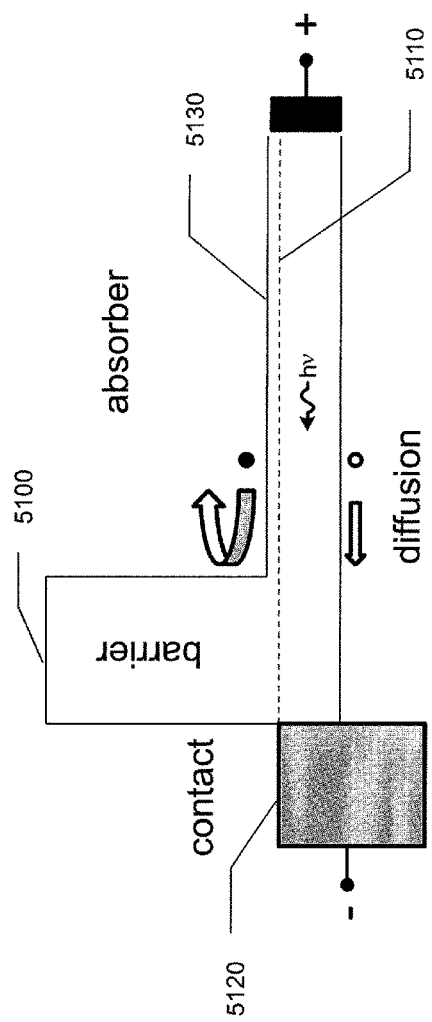

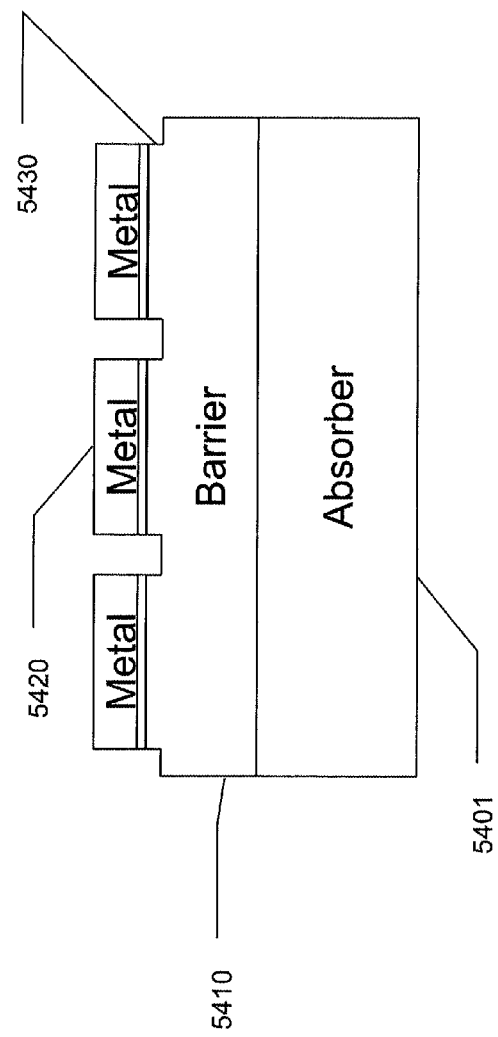

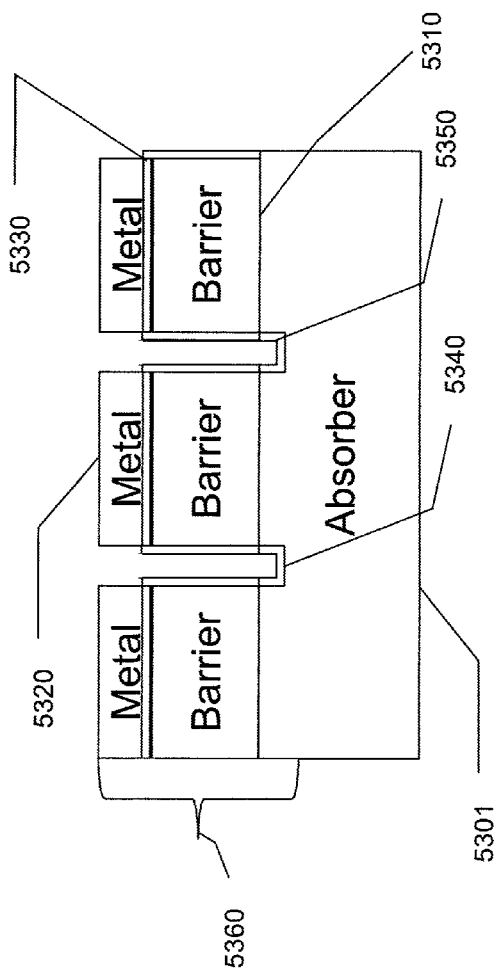

ated as U.S. Pat. No. 7,687,871 on Mar. 30, 2010, the entire contents

BARRIER PHOTODETECTOR WITH NO CONTACT LAYER

TECHNICAL FIELD

The present disclosure relates to barrier-type photo-detectors based on the structures disclosed in U.S. patent application Ser. No. 11/276,962 filed on Mar. 19, 2006, and issued as U.S. Pat. No. 7,687,871 on Mar. 30, 2010, the entire contents of which are hereby incorporated by reference. The present disclosure also relates to the composition, structure, and production of barrier-type photo-detectors.

BACKGROUND

This disclosure pertains to a reduced dark current barrier-type photo-detector that is comprised of a doped semiconductor layer, a barrier, and metal contacts disposed on the barrier where the doped semiconductor layer is used for photo-absorption and the effective conduction and valance band alignments for the doped semiconductor layer and barrier are arranged so as to allow photo-generated minority carrier flow to the contacts but filter or block majority carrier flow. Individual elements (e.g., pixels) in the photo-detector array may be defined by the metal contacts disposed on the barrier. The harrier, however, may be preserved such that it extends beyond the extent of the defined pixel areas. Although applicable to a wide range of barrier-type photo-detector, the exemplary embodiments and associated energy band diagrams presented in this disclosure depict an nBm barrier-type photo-detector. The structures and methods discussed herein, however apply as well to pBm (e.g., p-doped) structures. The "m" in this case stands for the metal disposed on the barrier to define readout pixels.

An embodiment of an exemplary nBn structure electron band diagram is illustrated in FIG. 1. The embodiment represents an embodiment of the concepts described in U.S. Pat. No. 8,044,435. The underlying concept relates to driving minority carriers from a photo absorbing layer 1000 to a contact region 1020 through a barrier 1010 where the compositions of the absorber layer, barrier, and contact layers are such that minority carriers can penetrate the barrier 1010 but majority carriers cannot. As can be seen in FIG. 2 and as discussed in U.S. Pat. No. 8,044,435,the pixels in the contact layer 2030 are isolated by etching down to, but not through, the barrier 2010 in order to accomplish pixel delineation. In the embodiment shown, each pixel is associated with a contact 2040 and a read-out interconnect point 2080. Minority carriers generated in the absorber layer 2000 pass through the barrier 2010 and into the contact layer 2030 where they are read-out through the interconnect 2080 via the contact 2040. This process complicates focal plane array structure and fabrication by requiring additional etch and passivation steps. This fabrication process results in etched mesas, which can contribute excessive dark current for small area devices.

It would be an improvement in terms of performance, manufacturability, reliability, versatility and production yield to delineate and isolate pixels in such a photo-detector in ways other than material removal. It would also be an improvement in terms of performance, manufacturability, reliability, versatility, and production yield to delineate and isolate pixels without the need for a contact layer.

SUMMARY

Aspects of the present disclosure are directed at barrier-type photo-detectors with no or minimal contact layers. Such detectors instead have delineated pixel regions defined by metal contacts disposed directly on or graded I alloyed down to the barrier.

Embodiments of techniques and devices disclosed herein may pertain to a photo-detector, such as, for example, an infra-red photo-detector, the photo-detector comprising: an absorber layer having predetermined majority and minority carrier types with corresponding energy bands; a barrier comprising a semiconductor with a barrier energy gap and corresponding conduction and valence bands, a first side of said barrier adjacent a first side of said absorber layer; and metal contact regions disposed on the barrier, the metal contact regions delineating pixels where image data may be read out from the photo-detector; wherein the barrier is configured so as to allow minority carrier current flow while blocking majority carrier current flow between the absorber layer and the metal contact regions.

In some embodiments, the photo-detector may include a passivation layer disposed between the metal contact regions and the barrier; the thickness and composition of the passivation layer being such that the minority carriers passing through the barrier tunnel through the passivation layer to reach the metal contact regions. In some embodiments, the metal contact regions may be alloyed through a passivation layer disposed between the metal contact regions and the barrier, the alloy creating a direct metal contact with the barrier. In some embodiments, the metal contact regions may include molybdenum or a molybdenum alloy. In some embodiments, the photo-detector may include a substrate layer comprising a semiconductor, the absorber layer being disposed between the substrate layer and the barrier.

In some embodiments, the absorber layer is an n-doped semiconductor. In some embodiments, the barrier is an un-doped semiconductor. In some embodiments, the barrier has high aluminum content and the detector further comprises a passivation layer disposed between the metal contact regions and the barrier, the passivation layer being configured to prevent oxidation of the barrier by preventing the barrier from being exposed to air.

In some embodiments, the barrier includes a mesa structure extending past a furthest extent of the metal contact regions. In some embodiments, the barrier includes a plurality of protruding portions disposed on the mesa structure such that the protruding portions of the harrier are physically separated from each-other and such that each protruding portion of the barrier is physically connected to the mesa structure; and the metal contact regions are disposed on the protruding portions.

In some embodiments, the photo-detector may include a plurality of pixel stacks, each pixel stack including a metal contact region, a barrier layer portion, and an absorber layer portion; and each pixel stack being physically separated from the other of said plurality of pixel stacks such that each barrier layer portion in a pixel stack is physically isolated from a barrier layer portion in another pixel stack.

Embodiments of techniques and devices disclosed herein may pertain to a method of making a barrier-type photo-detector, such as, for example, an infra-red photo-detector, the method comprising: providing an absorber layer having predetermined majority and minority carrier types with corresponding energy bands; providing a barrier comprising a semiconductor with a harrier energy gap and corresponding conduction and valence bands, a first side of said barrier adjacent a first side of said absorber layer; providing metal contact regions on the second side of said barrier, the metal contact regions delineating pixels where image data may be read out from the photo-detector; and configuring the barrier so as to allow minority carrier current flow while blocking majority carrier current flow between the absorber layer and the metal contact regions.

In some embodiments, the method further includes providing a passivation layer on a second side of said barrier opposing said first side; said providing the passivation layer being performed in-situ during photo-detector manufacturing.

In some embodiments, the method further includes providing a passivation layer on a second side of said barrier opposing said first side; etching a pattern into the provided passivation layer in-situ; and providing the metal contact regions including providing metal into the etched pattern in the passivation layer. In some embodiments, etching a pattern is performed with a dry-etching technique.

In some embodiments, providing metal contact regions includes: providing a continuous layer of metal on the second side of said barrier; and performing in-situ etching of the continuous layer of metal to create the metal contact regions. In some embodiments, the method further includes: providing a passivation layer between the barrier and the metal contact regions; and alloying the metal contact regions through the passivation layer to create a direct metal contact with the barrier.

In some embodiments, providing the metal contact regions includes providing the metal contact regions onto the second side of the barrier; and creating a passivation layer on the barrier by allowing those portions of the second side of the barrier not covered by metal contact regions to become oxidized. In some embodiments, the method further includes: etching the barrier layer to create a mesa structure extending past a furthest extent of the metal contact regions.

In some embodiments, etching the barrier further includes etching the barrier to create a plurality of protruding portions disposed on the mesa structure such that: the protruding portions of the barrier are physically separated from each-other; each protruding portion of the barrier is physically connected to the mesa structure; and the metal contact regions are disposed on the protruding portions.

In some embodiments, the method further includes: etching the photo-detector to create a plurality of pixel stacks, each pixel stack including a metal contact region, a barrier layer portion, and an absorber layer portion; said etching being performed to etch completely through the barrier layer portion such that each pixel stack is physically separated from the other of said plurality of pixel stacks and such that each barrier layer portion in a pixel stack is physically isolated from a barrier layer portion in another pixel stack.

Further scope of applicability of the present invention will become apparent from the detailed description given hereinafter. However, it should be understood that the detailed description and specific examples, while indicating preferred variations of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein:

FIG. 4a shows an embodiment of a barrier-type photo-detection array with pixels delineated by contacts disposed on a passivation layer;

FIG. 4b shows an embodiment of a barrier-type photo-detection array with pixels delineated by contacts surrounded by a passivation layer;

FIG. 5a shows an energy-band diagram in a pixel region of a barrier-type photo-detector as described herein;

FIG. 5c shows an embodiment of a barrier-type photo-detection array with pixels delineated by contacts disposed on an etched barrier; and FIG. 5d shows an embodiment of a barrier-type photo-detection array with pixels delineated by contacts disposed on an etched barrier.

The drawings will be described in detail in the course of the detailed description of the invention.

DETAILED DESCRIPTION

The following detailed description of the invention refers to the accompanying drawings. The same reference numbers in different drawings identify the same or similar elements. Also, the following detailed description does not limit the invention. Instead, the scope of the invention is defined by the appended claims and equivalents thereof.

Improved reliability, radiation hardness, manufacturability, cost savings, and improved production yields can be realized by modifying the structure of a barrier-type detector in ways other than removal of semiconductor material to accomplish pixel isolation. In particular, elimination of a contact layer and application of metal directly to the barrier may make barrier-type photo-detectors more reliable, easier to manufacture, and able to operate at higher temperatures. Further benefits of such modification include drastic reduction or elimination of surface states that would otherwise occur in the mesa sidewalls of the contact layer, which lead to benefits such as improved reliability and radiation hardness. The pixel delineation, according to the teachings of the present application, can be formed by any standard semiconductor metallization technique such as lift-off, blanket vapor deposition or sputtering followed by dry or wet etching. Additionally, the patterned metal can be alloyed with/through the continuous barrier passivation layer.

Figure 2:
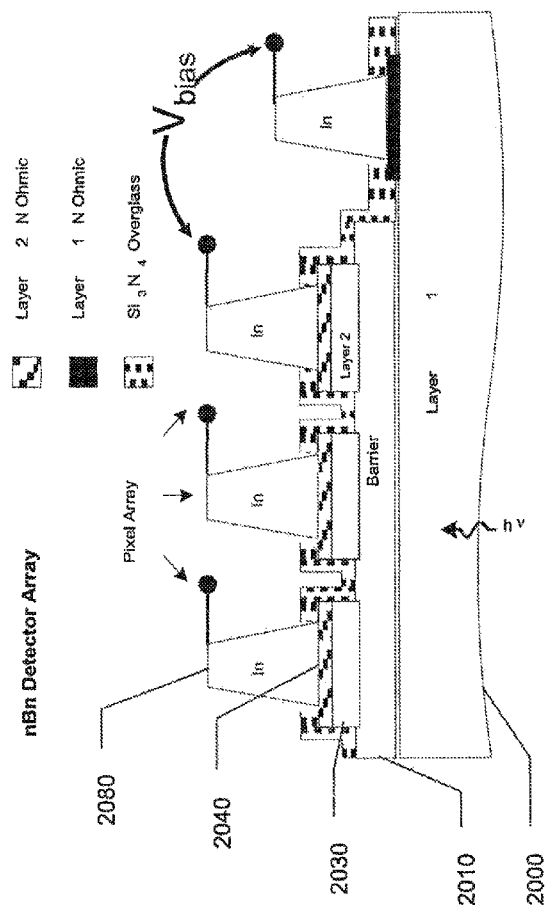
FIG. 2 shows an embodiment of a barrier-type photo-detection array with pixels delineated by layer material removal.

In some embodiments of a device as depicted in FIG. 2, the barrier 2010 may be constructed of a material that may rapidly oxidize upon exposure to air. In an nBn device, the contact layer 2030 may prevent barrier oxidation and allow current collection at the contact 2040. However, charge separation happens at the barrier interface, so in some embodiments a function of the contact layer 2030 is carrier recombination. The contact layer 2030, because it is a semiconductor, may incur some undesirable side effects. For example, light absorbed by the contact layer 2030 is lost. Also, doping of contact layer 2030 builds in the need for a higher operating voltage and therefore an inherently higher dark current level.

In some embodiments, minority carrier recombination can be realized in a metal. interface without a contact layer. However, embodiments using barriers with high aluminum content may require a passivation layer (such as, for example, a GaSb layer) to prevent barrier oxidation. In some embodiments, metal contacts may be deposited onto the passivation layer.

An example of a structure with isolated pixels made of metal is illustrated in FIG. 4a. Any suitable method for applying metal contact 3050 to a passivated barrier 3020 may be used as long as such methods allow vertical minority carrier transport from the absorber layer 3010 through the barrier 3020, to the individual pixel regions 3050, which represent the pixel interconnect points. Such a solution also inherently prevents lateral transport of minority carriers between pixels because the metal contacts 3050 are physically separated from each-other, eliminating or reducing lateral conductivity and making crosstalk virtually impossible.

Figure 1:
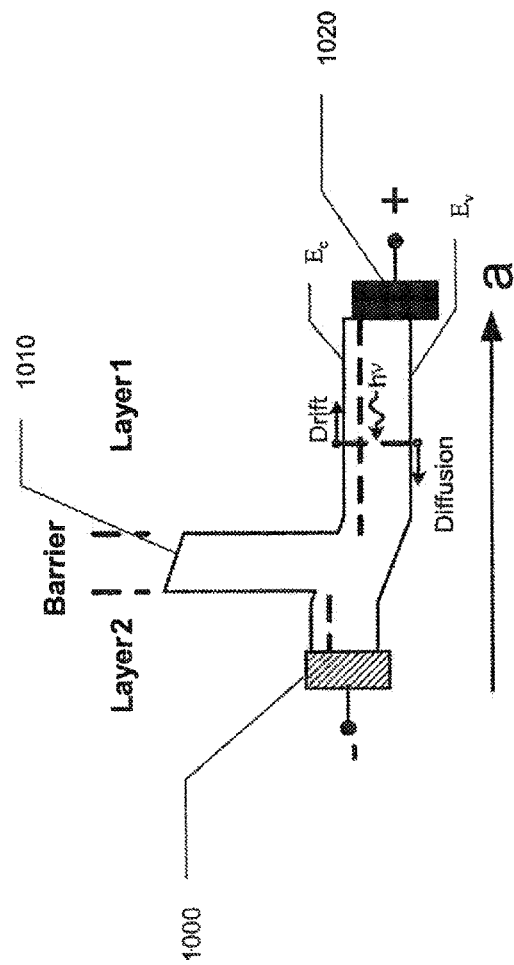
FIG. 1 shows an energy-band diagram in a barrier-type photo-detector.

Delineated pixel regions 3050 of the type illustrated in FIG. 4a can be accomplished by replacing the steps of contact etching, barrier oxidation, barrier passivation otherwise required in an nBn device of the type shown in FIG. 1 with a mask-less barrier passivation step followed by deposition of metal contacts onto the passivation layer 3030. The barrier passivation layer 3030 may be deposited epitaxially in-situ. Etching or patterning of the passivation layer 3030 may be avoided in some embodiments where a passivation layer 3030 material is chosen to have a high resistance to lateral transport. This prevents crosstalk or shorting between adjacent pixels without requiring an etched passivation layer 3030.

The semiconductor materials used in the barrier 3020 and I or absorber layers 3010 can be composed of a wide range of semiconductors including Si, InAs, GaSb, GaAs, InSb, AlAs, AlSb, HgCdTe, InAsSb, InAsGaSb or any other suitable materials or material combinations that supply the valance and conduction band relationships for passing minority carriers or blocking or suppressing the flow of majority carriers through the barrier. These materials can be formed of suitable amorphous, bulk crystalline, digital alloy, or superlattice configurations. Further improvements in material properties can also be gained through the incorporation of Bi, N, or other materials to the above-listed semiconductors (or combinations thereof). Such alterations in material properties and strain can change the bandgap or conduction or valence band alignments to achieve a desired valence and conduction band configuration such as contemplated in FIGS. 1 and 5a.

Embodiments of barriers 3020 can be constructed of uniform alloys, superlattices, digital alloys, strain compensation layering or other bandgap-engineered structures. Desirably, the effective conductance and valance band alignments allow the flow of photo-generated minority carriers but block the flow of majority carriers.

Embodiments of absorber layer 3010 may include n-doped or p-doped semiconductors. In some variations, the absorber layer may be un-intentionally doped.

In the embodiment depicted in FIG. 4a, the metal contacts 3050 may be used with conventional Indium type pixel interconnects common for infra-red focal plane arrays. Alternate embodiments can employ a wide range of interconnect methods in combination with embodiments of the present invention. Alternate interconnect embodiments may include methods developed using micro-electrical-mechanical-systems (MEMS) processing and other known methods developed for silicon integrated circuit interconnects.

Figure 3:
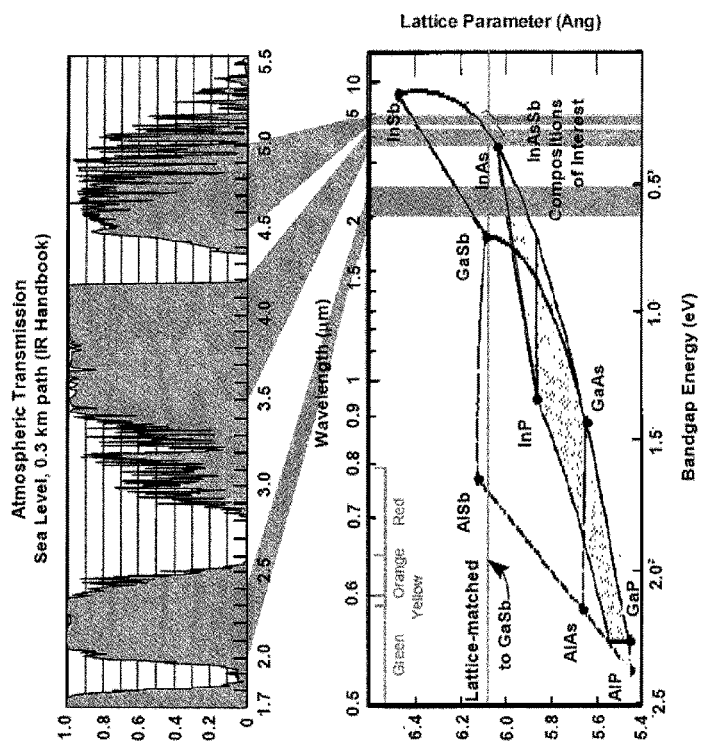
FIG. 3 shows an exemplary electro-optical radiation wavelength spectrum and the relationship with an exemplary compound semiconductor material system.

Further variations on the embodiments of the photo-detector described above can include different types of semiconductor (barrier, absorber layer, substrate) having different material combinations or doping types or concentrations. In some embodiments, a bandgap of the photoabsorbing layer (absorber layer 3010) can be designed to have a maximum cutoff wavelength that supports the absorption of electromagnetic radiation within the ultraviolet, visible, shortwave (SW), midwave (MW) or longwave (LW) atmospheric transmission bands as shown in FIG. 3. Strain can be introduced into an embodiment of a photo-detecting structure to favorably improve the energy band alignments. In embodiments where the barrier 3020 is sufficiently thin so as to not dislocate, often referred to as beneath the critical thickness, the barrier 3020 can be subjected to higher strain than in the absorber layer 3010 due to its thickness. Barrier 3020 embodiments can combine strain with layered materials to bandgap engineer the band alignment favorable to the carrier filtering function (passing minority carriers While blocking majority carriers). In some embodiments, a metamorphic (e.g., strain relaxed) absorber material may be used in the absorber layer 3010. In such embodiments, the barrier 3020 may exceed the critical thickness.

In the embodiment shown, the barrier passivation layer 3030 is sufficiently thin to allow minority carriers to tunnel through from the barrier 3020 to the metal contacts 3050. The lateral conductivity issue is eliminated because the barrier layer 3020 and the passivation layer 3030 result in high pixel-to-pixel impedance.

In alternate embodiments, such as the one shown in FIG. 4b, pixel delineation may be accomplished by alloying the metal 3100 into the passivation layer 3110 to create a direct metal contact between the barrier 3120 and the metal 3100. In some embodiments this may be realized by putting a thin metal layer down over the passivation layer 3110, patterning the metal layer (using, for example, either wet etch or dry etch in-situ without lift-off), and then alloying the patterned metal 3100 into the passivation layer 3110 to create the direct metal contact.

In another embodiment, barrier oxidation may be employed as a passivation technique. In such an embodiment, the passivation layer 3110 may be removed after metal (such as, for example, molybdenum or a molybdenum alloy) is patterned onto the barrier 3120. A wet or dry in-situ etch may then be performed to pattern the metal into contacts 3100 that are directly contacting the barrier. The barrier may then be allowed to oxidize in those regions not covered with contacts 3100, effectively creating a passivation layer 3110 in the oxidized portions. In some embodiments, such as, for example, a technique using $SF_6$/Ar dry etching of blanket deposited TiW contact metal, pixels with spacing of between 80 and 120 nm can be realized.

By eliminating the contact layer altogether, fabrication of a detector as disclosed herein can be simplified. Defects and opportunities for patterning error or contamination associated with masking and lift-off operations can be eliminated. By eliminating the existence of etched surfaces on side walls of delineated pixels surface recombination and surface dark current generation are further reduced, thereby allowing for further improvements in quantum efficiency, sensitivity and I or higher temperature operation.

In some embodiments, valence band alignment issues that would otherwise exist between the barrier and a contact layer are removed. As shown in FIG. 1, close (and, in some cases, near-perfect) band alignment is required. In addition, valence band barriers can exist even for perfectly aligned barrier interfaces, causing increased operating voltage. Decreasing the operating bias reduces the required absorber depletion region, resulting in reduction in G-R. current. Eliminating the contact layer relaxes the band gap alignment requirement somewhat by removing the contact layer related valance band barriers. The voltage required for minority carrier collection is then reduced because impediments to hole flow on the contact side of the barrier are removed, thereby reducing the dark current levels in the detector.

The specific energy-band properties of a barrier-type detector having isolated pixel regions created without a contact layer is explained with reference to the embodiment shown in FIG. 5a. FIG. 5a depicts an energy band configured for carrier transport through the barrier 5100 for photo-detection in the pixel region 5120 at the contact. A voltage bias for operation is applied between the contact 5120 and absorber layer 5130 terminals.

As can be seen from the diagram in FIG. 5a, a detector as discussed herein performs similarly to barrier-type photodetectors having a contact layer. The barrier 5100 conduction $E_c$ and valence $E_v$ band alignments are designed to allow the flow of photo-generated minority carriers from the absorber layer 5130 and block the flow of majority carriers. Replacing the doped contact layer otherwise found in nBn-type devices with metal contact 5120 reduces the voltage required for minority carrier collection. Furthermore, this reduced voltage reduces the depletion zone in the absorber layer, resulting in reduced levels of parasitic dark current. This can be realized because suppression of majority carrier flow through the barrier 5100 prevents these carriers from being depleted in the absorber layer 5130. Furthermore, in the embodiment shown, the work. function of the metal contact 5120 is selected so that it is aligned to the Fermi level 5110 of the absorber layer 5130. By preventing the Fermi level 5110 of the absorber layer from passing through the middle of the band gap, the activation energy for dark current generation of the device is further increased, thereby reducing carrier generation and collection.

Figure 5B:
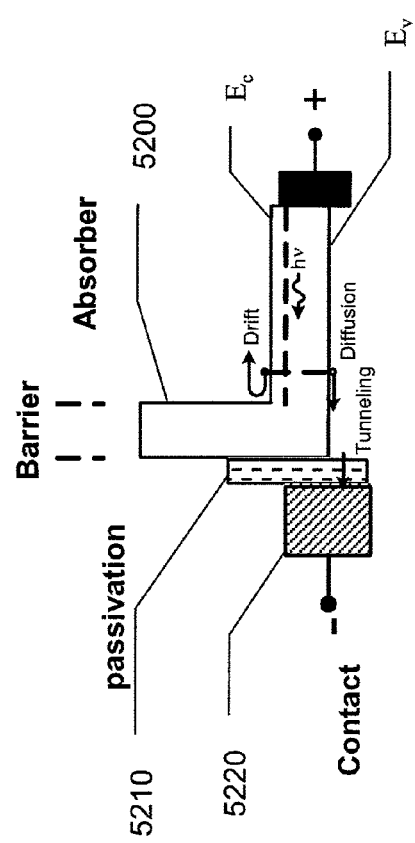
FIG. 5b shows an energy-band diagram in a pixel region of a barrier-type photo-detector as described herein.

In an embodiment as depicted in FIG. 5b, the barrier 5200 may be covered with a passivation layer 5210 that is in contact with metal contact 5220. Such an embodiment may have the energy band properties shown. In the embodiment shown, the passivation layer 5210 disposed on the barrier 5200 is non-conductive, thereby passivating majority or minority carrier flow and reducing or minimizing lateral carrier transport between metal contact 5220. The passivation layer 5210 portions not covered with a metal contact 5220 delineate pixels while eliminating lateral conduction and crosstalk, and allow at least part of the barrier 5200 to extend underneath as grown, maintaining the passivating properties at the exposed surfaces. The passivation layer 5210 portions covered with a metal contact 5220 allow for minority carrier transport to the metal contact 5220. In some embodiments, this may be realized by having the minority carriers tunnel through the passivation layer 5201. In other embodiments, this may be realized by alloying the metal contact 5220 into the passivation layer to create a more direct metal contact with the barrier. In yet further embodiments, the metal contact 5220 may be partially alloyed into the passivation layer 5210 to reduce the distance that a carrier must tunnel through before being collected for recombination and readout.

In yet another embodiment, the barrier interfaces can be compositionally graded to provide for minority carrier transport while avoiding charge trapping and undesirable carrier recombination at the barrier interfaces. Embodiments having graded interfaces can reduce the reverse bias needed to extract photo-generated carriers while reducing or eliminating charge storing behavior. In some embodiments, grading of the barrier composition at the absorber interface can reduce or eliminate notches, which can arise in ungraded interfaces that may result in higher required bias voltages, charge storage effects, or reductions in quantum efficiency due to carrier recombination. Such embodiments may entail a more complex or involved growth process for the barrier than the structure of FIG. 5a. Such graded barrier or graded interface embodiments may be realized by applying the techniques and structures disclosed in U.S. Pat. No. 8,044,435, the entire contents of which are hereby incorporated by reference.

In yet another embodiment, doping profiles of the absorber layer and/or barrier can be adjusted to ensure zero-bias detectivity. In some embodiments, the barrier interface and/or bulk are doped such that the Femi-level of the absorber layer and the contact layer are aligned with no built-in potential across the valance band.

In yet further embodiments, such as the one depicted in FIG. 5c, a direct-metal barrier-type detector may include a fully or partially etched barrier 5410. In such an embodiment, a mesa structure may be etched into the barrier 5410 by etching individual pixel regions such that each metal contact 5420 is disposed on a portion of barrier 5410 protruding above an overall mesa structure in the barrier 5410 that extends beyond the individual pixel regions. In some embodiments, the absorber layer 5401 may be co-extensive with the barrier mesa. In other embodiments, the absorber layer may be fully covered by the barrier (not shown). Also, in some embodiments, the barrier mesa and exposed sides of the protruding portions 5430 may be covered with a passivation layer (not shown) to prevent oxidation of the barrier. In some embodiments, such a passivation layer may also be disposed between the metal contact 5420 and the barrier 5410 in the manner described above in FIG. 4a.

In yet another embodiment, such as the one depicted in FIG. 5d, an nBm (semiconductor-barrier-metal) photo-detector may include a fully or partially etched absorber layer 5301 in addition to a fully or partially etched barrier 5310. On some embodiments, as pixel pitches become ever-smaller, the lateral diffusion component of cross-talk (modulation transfer function) becomes more punitive. One approach to address this is to etch partially or fully through the absorber layer 5301. Quantum efficiency (QE) and I or fill factor may be traded off for modulation bandwidth in such an embodiment. In the embodiment shown in FIG. 5d, the metal contact 5320 may be disposed directly onto the barrier 5310 or may be disposed onto a thin passivation layer 5330 disposed on the barrier 5310 as described previously. The barrier (as well as, in some embodiments, the passivation layer 5330 and I or the metal contact 5320) may be etched through down to the absorber layer 5301. In some embodiments, the absorber layer 5301 may also be partially etched 5350 or fully etched (not shown) down to a substrate material (not shown). In some such embodiments, the individual pixel stacks 5360 including the metal contact 5320, barrier 5310, and etched absorber layer 5301 portion may have the exposed portions of the barrier 5310 and absorber layer 5301 covered with a passivation layer 5350. In some embodiments, this may be the same passivation layer 5330 as that disposed between the metal 5330 and the barrier 5310. In other embodiments, there may be no passivation layer 5330 between the barrier 5310 and the metal contact 5320, allowing for direct metal contact with the barrier.

The invention being thus described, it will be obvious that the same may be varied in many ways. Such variations are not to be regarded as departure from the spirit and scope of the invention, and all such modifications as would be obvious to one skilled in the art are intended to be included within the scope of the following claims.

The invention claimed is:
1. A photo-detector comprising:
an absorber layer having predetermined majority and minority carrier types with corresponding energy bands;

a barrier comprising a semiconductor with a barrier energy gap and corresponding conduction and valence bands, a first side of said barrier adjacent a first side of said absorber layer;
metal contact regions disposed above the barrier, the metal contact regions delineating pixels where image data may be read out from the photo-detector; and
a passivation layer disposed between the metal contact regions and above the barrier, the passivation layer configured to prevent oxidation of the barrier by preventing the barrier from being exposed to air and to prevent crosstalk between adjacent pixels;
wherein the barrier is configured so as to allow minority carrier current flow while blocking majority carrier current flow between the absorber layer and the metal contact regions; and
wherein thickness and composition of the passivation layer being such that the minority carriers passing through the barrier tunnel through the passivation layer to reach the metal contact regions and the photo-detector does not include a doped semiconductor contact layer.

2. The photo-detector of claim 1, the metal contact regions including molybdenum or a molybdenum alloy.

3. The photo-detector of claim 1, where the absorber layer is an n-doped semiconductor.

4. The photo-detector of claim 1, where the barrier is an un-doped semiconductor.

5. The photo-detector of claim 1, where the barrier has aluminum content.

6. The photo-detector of claim 1, the photo-detector including a plurality of pixel stacks, each pixel stack including a metal contact region, a barrier layer portion, and an absorber layer portion; and
each pixel stack being physically separated from the other of said plurality of pixel stacks such that each barrier layer portion in a pixel stack is physically isolated from a barrier layer portion in another pixel stack.

7. The photo-detector of claim 1, where the barrier includes a mesa structure extending past a furthest extent of the metal contact regions.

8. The photo-detector of claim 7, the barrier layer including a plurality of protruding portions disposed on the mesa structure such that the protruding portions of the barrier are physically separated from each-other and such that each protruding portion of the barrier is physically connected to the mesa structure; and
the metal contact regions being disposed on the protruding portions.

9. A method of making a barrier-type photo-detector, the method comprising:
providing an absorber layer having predetermined majority and minority carrier types with corresponding energy bands;
providing a barrier layer comprising a semiconductor with a barrier energy gap and corresponding conduction and valence bands, a first side of said barrier layer adjacent a first side of said absorber layer;
providing a passivation layer on a second side of said barrier layer, the second side of the barrier layer is opposite to the first side, the passivation layer does not include a doped semiconductor material or metal structures;
providing metal contact regions on and in direct contact with the passivation layer, the metal contact regions delineating pixels where image data may be read out from the photo-detector; and
configuring the barrier so as to allow minority carrier current flow while blocking majority carrier current flow between the absorber layer and the metal contact regions.

10. The method of claim 9, where said providing the passivation layer being formed in-situ during photodetector manufacturing.

11. The method of claim 9, where providing metal contact regions include:
providing a continuous layer of metal; and
performing in-situ etching of the continuous layer of metal to create the metal contact regions.

12. The method of claim 9, the method further comprising etching the photo-detector to create a plurality of pixel stacks, each pixel stack including a metal contact region, a passivation layer portion, a barrier layer portion, and an absorber layer portion;
said etching performed to etch completely through the passivation layer and the barrier layer such that each pixel stack is physically separated from the other of said plurality of pixel stacks and such that each barrier layer portion in a pixel stack is physically isolated from a barrier layer portion in another pixel stack.

13. The method of claim 9, the method further comprising:
etching a pattern into the passivation layer and the barrier layer to create a mesa structure between adjacent metal contact regions.

14. The method of claim 13, where the etching a pattern is performed through the barrier layer and into the absorber layer.

15. The method of claim 9, the method further comprising etching the barrier layer to create a mesa structure extending past a furthest extent of the metal contact regions.

16. The method of claim 15, where etching the barrier further includes etching the barrier to create a plurality of protruding portions disposed on the mesa structure such that:
the protruding portions of the barrier are physically separated from each-other;
each protruding portion of the barrier is physically connected to the mesa structure; and
the metal contact regions are disposed on the protruding portions.

* * * * *